United States Patent
Cameron et al.

(10) Patent No.: US 6,788,140 B2
(45) Date of Patent: Sep. 7, 2004

(54) ULTRA-LOW DISTORTION, WIDE-BANDWIDTH AMPLIFIER ARCHITECTURE USING ACTIVELY PHASE-MATCHED FEED-FORWARD LINEARIZATION

(75) Inventors: Jay K. Cameron, Dallas, TX (US); Philip S. Stetson, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/348,147

(22) Filed: Jan. 21, 2003

(65) Prior Publication Data

US 2003/0184373 A1 Oct. 2, 2003

Related U.S. Application Data

(60) Provisional application No. 60/356,872, filed on Feb. 13, 2002.

(51) Int. Cl.[7] .................................................. H03F 1/26
(52) U.S. Cl. ........................................ 330/149; 330/151
(58) Field of Search .............................. 330/149, 150, 330/151, 310, 124 R

(56) References Cited

U.S. PATENT DOCUMENTS

| | | | | |
|---|---|---|---|---|
| 5,015,965 A | * | 5/1991 | Katz et al. | .................. 330/149 |
| 5,258,722 A | * | 11/1993 | Jeffers | ........................ 330/149 |
| 6,335,660 B1 | * | 1/2002 | Frecassetti et al. | ......... 330/149 |
| 6,538,509 B2 | * | 3/2003 | Ren | ............................ 330/149 |

OTHER PUBLICATIONS

Yongwang Ding, et al., "A+18dBm IIP3 LNA in 0.35μm CMOS" IEEE ISSCC Digest of Technical Papers, pp. 162–163, 2001.

* cited by examiner

*Primary Examiner*—Khanh Van Nguyen
(74) *Attorney, Agent, or Firm*—Alan K. Stewart; W. James Brady, III; Frederick J. Telecky, Jr.

(57) ABSTRACT

An amplifier architecture using actively phase-matched feed-forward linearization includes: a first signal path having a scaling amplifier 40 in series with a main amplifier 42; a second signal path having a replica amplifier 44 in series with a correction amplifier 46; and a combining node 48 that combines the first signal path and the second signal path. This topology places the scaling amplifier 40 in the main signal path. By inverting the scaling factor from β to 1/β, this topology retains the distortion cancellation property while balancing the two signal paths. In this case the scaling amplifier 40 attenuates the input signal rather than amplifying it. The end result remains the same. The main amplifier output signal is lower than the replica amplifier's by a factor of β. This results in a third-order distortion component that is $β^3$ times bigger at the replica amplifier output. By correcting this level down to that at the main amplifier 42, the fundamental component in the feed-forward path is significantly attenuated. When the two signal paths combine, the third-order distortion components cancel while the fundamental is attenuated to a far lesser degree.

10 Claims, 1 Drawing Sheet

ULTRA-LOW DISTORTION, WIDE-BANDWIDTH AMPLIFIER ARCHITECTURE USING ACTIVELY PHASE-MATCHED FEED-FORWARD LINEARIZATION

This application claims priority under 35 USC §119 (e)(1) of provisional application No. 60/356,872 filed Feb. 13, 2002.

FIELD OF THE INVENTION

This invention generally relates to electronic systems and in particular it relates to an amplifier architecture using actively phase-matched feed-forward linearization.

BACKGROUND OF THE INVENTION

The performance of broadband and wireless communication systems is becoming increasingly limited by the analog signal chain because the analog portion is required to operate at higher frequencies with larger dynamic range, decreased distortion, and smaller power supply voltages. Communications receivers in particular have pushed the performance of analog components. Such base station designs currently demand the highest performance analog-to-digital converters available. Driving the received signal to these converters requires an amplifier that is characterized by dynamic range and distortion performance levels greater than the converter itself. Many receiver architectures also employ subsampling techniques that require the amplifier to maintain this linearity at frequencies approaching (and soon to surpass) 100 MHz. Attaining −106 dBc of distortion performance at 100 MHz (supporting a full 16-bits of resolution into the digital signal processor) is the current goal in high-performance analog design.

Future trends in communications systems will make the linearity of amplifiers even more paramount. The much discussed 3G standards for wireless communications employ a modulation methodology known as Orthogonal Frequency Division Multiplexing (OFDM). This multi-channel modulation scheme provides the key benefit of immunity to inter-symbol interference that plagues many current communications systems. The cost of this immunity is increased linearity requirements. In such systems the intermodulation distortion of an amplifier plays a particularly important role in dictating performance. Filtering in most systems serves to reduce the contribution of harmonic distortion products to the degradation of system performance. However, the intermodulation distortion products (primarily the third-order intermodulation distortion) can fall directly within band in such multi-channel systems, often corrupting adjacent channels in the spectrum. Thus the trend towards increased linearity requirements and high frequency operation combine to form a powerful motivation for developing amplifier architectures that maintain ultra-low distortion across wide frequency bands.

Many previous works have explored "feed-forward" as a means of removing an amplifier's distortion products from its output. These techniques involved complex and precisely tuned delay paths and attenuation/gain paths in an attempt to remove all distortion products from the amplifier's output signal.

The technique described in the prior art shown in FIG. 1 is the first to specifically target third-order distortion products. The technique drastically simplifies the analog signal processing required for effective distortion cancellation. The removal of third-order distortion is highly desirable. The magnitude of harmonic components typically decreases with increasing order. Even-order harmonic products (of which the $2^{nd}$ is most significant) are readily suppressed through the use of differential signal paths. This has been done in several recent operational amplifier designs. Third-order harmonic distortion and its related intermodulation distortion are typically the most significant terms remaining. However, no recent amplifier designs, except the prior art of FIG. 1, have made anything more than incremental improvements in third-order distortion performance. This is especially true of the third-order intermodulation distortion which appears at a frequency approximately that of the input signal. While higher odd-order harmonic products also produce related intermodulation products near the input signal frequency, they are typically less significant than the third-order products. For these reasons, the technique cited in the prior art shown in FIG. 1 is an important development in analog signal processing.

The prior art technique of FIG. 1 is a feed-forward linearization technique published in the 2001 IEEE ISSCC Proceedings, Ding, Y., "A +18 dBm IIP3 LNA in 0.35 $\mu$m CMOS," IEEE ISSCC Digest of Technical Papers, pp. 162–163, 2001. The prior art amplifier shown in FIG. 1 includes main amplifier 20 in the main signal path; scaling amplifier 22, replica amplifier 24, and correcting amplifier 26 in the feed-forward signal path; summing node 28 which combines the main signal and the feed-forward signal; input node x; and output node $Y_{out}$. The equations that describe the operation of the prior art of FIG. 1 are shown below:

$$out20 = Ax + A\alpha_1 x^3$$

$$out22 = \beta x$$

$$out24 = A(\beta x) + A\alpha_1(\beta x)^3 = A\beta x + A\alpha_1 \beta^3 x^3$$

$$out26 = \frac{A}{\beta^2}x + A\alpha_1 x^3$$

$$y_{out} = Ax + A\alpha_1 x^3 - \left(\frac{A}{\beta^2}x + A\alpha_1 x^3\right) = A\left(1 - \frac{1}{\beta^2}\right)x$$

where A is the gain of amplifiers 20 and 24, x is the input signal, $\alpha_1$ is the coefficient for the third order term, $\beta$ is the gain for scaling amplifier 22, $1/\beta^3$ is the gain for correcting amplifier 26, out20 is the output of amplifier 20, out22 is the output of amplifier 22, out24 is the output of amplifier 24, and out26 is the output of amplifier 26.

The underlying principle behind the linearization technique introduced in the prior art of FIG. 1 is that an amplifier's transfer function can be expressed as a Taylor series expansion of the form $y = a_1 x^2 + a_3 x^3 + \ldots + a_n x^n$. Limiting the number of terms in the expansion reduces the model's accuracy, but is often acceptable under certain circumstances. The amplifier transfer function in the above analysis includes only the fundamental and third-order terms as shown by out20 in the above equations. This is a reasonable approximation because a differential signal path suppresses the even-order harmonics (the terms with even powers of x). Furthermore, many systems include filters that attenuate the higher-order harmonics. The third-order term remains because it generates distortion products near the fundamental through intermodulation.

Another important point to note is that the third-order term varies as the cube of the input. Thus an amplifier with twice the input signal will produce eight times the third-order harmonic distortion. The system illustrated in FIG. 1 exploits this relationship.

The system includes two signal paths, the main path through main amplifier 20, and the feed-forward path through scaling amplifier 22, replica amplifier 24, and correction amplifier 26. The feed-forward path begins by scaling the input by a factor of β. By using a replica amplifier 24 that is identical to the main amplifier 20, the scaled input signal produces a third-order harmonic that is $\beta^3$ times bigger than that produced at the output of the main amplifier 20. The correction amplifier 26 reduces the level of this distortion by a factor of 1/β. This equalizes the third harmonic distortion with the third harmonic component of the main amplifier output, while attenuating the fundamental component in the feed-forward signal path. When these two signal paths are combined at the summing node 28, the third harmonic component is eliminated while the fundamental is only slightly attenuated as described by the equation of $y_{out}$. This is an important result because the same mechanism that produces the third-order harmonic distortion (which can often be filtered) also produces the third-order intermodulation distortion (which cannot be filtered). Note that the addition of feed-forward paths tailored to address higher-order distortion products is possible.

The prior art technique of FIG. 1 has several problems, which include:

1. The unbalanced nature of the main and feed-forward signal paths results in phase mismatch at the summing node 28. Phase mismatch causes poor distortion cancellation with increasing frequency because the signals at the main and correction amplifier outputs do not coincide in the time domain. As the phase mismatch swings from 0 degrees to 180 degrees, the efficacy of the feed-forward technique ranges from complete cancellation to complete constructive interference (where the third-order distortion actually becomes twice as large).

2. The cited prior art makes use of simple differential-pair amplifiers. This open-loop amplifier configuration relies on inherent distortion performance and does not take advantage of the linearizing properties of feedback.

3. The implementation is also tuned for operation over a narrow range of frequencies. This implies a narrow band of effective distortion cancellation.

SUMMARY OF THE INVENTION

An amplifier architecture using actively phase-matched feed-forward linearization includes: a first signal path having a scaling amplifier in series with a main amplifier; a second signal path having a replica amplifier in series with a correction amplifier; and a combining node that combines the first signal path and the second signal path. This topology places the scaling amplifier in the main signal path. By inverting the scaling factor from β to 1/β, this topology retains the distortion cancellation property while balancing the two signal paths. In this case the scaling amplifier attenuates the input signal rather than amplifying it. The end result remains the same. The main amplifier output signal is lower than the replica amplifier's by a factor of β. This results in a third-order distortion component that is $\beta^3$ times bigger at the replica amplifier output. By correcting this level down to that at the main amplifier, the fundamental component in the feed-forward path is significantly attenuated. When the two signal paths combine, the third-order distortion components cancel while the fundamental is attenuated to a far lesser degree.

DETAILED DESCRIPTION OF PREFERRED EMBODIMENTS

Figure 2:
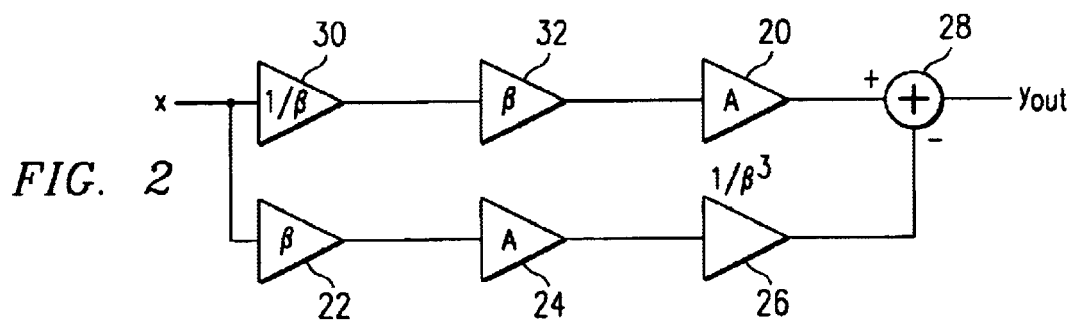
FIG. 2 is a diagram of a first preferred embodiment amplifier using actively phase-matched feed-forward linearization.

The first preferred embodiment shown in FIG. 2 comprises an amplifier architecture that takes advantage of both feed-back and feed-forward linearization to achieve ultra-low levels of distortion across a wide frequency range. The proposed topology is applicable to any amplifier design (programmable gain, full-differential, etc.), can be fully integrated into many semiconductor process technologies, and provides a revolutionary improvement in distortion performance for a given process technology node. Modern small geometry process technologies are particularly well suited as they realize small die area, good yield, and low cost to complement the high performance.

Figure 1:
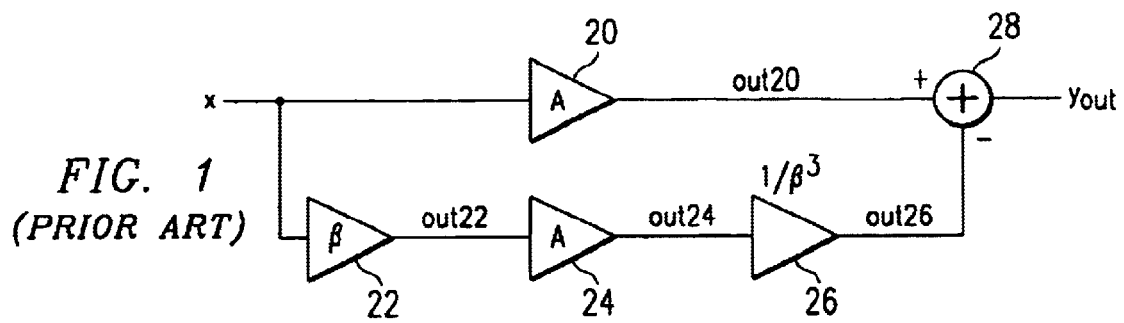
FIG. 1 is a diagram of a prior art amplifier using a feed-forward linearization technique.

The first preferred embodiment block diagram shown in FIG. 2 corrects the major problems identified in the prior art of FIG. 1. The describing equations remain the same, but the system achieves significantly better phase-matching through the addition of active components 30 and 32. With A>β (for example A=4 and β=2), the signal level at the output of the first phase matching amplifier 30 will be relatively small, while the output at the second phase matching amplifier 32 basically restores the signal to its original level. Since the third-order distortion is proportional to the cube of the input signal, and the output of the main amplifier 20 will be significantly larger than that at the phase-matching output, distortion introduced by the two additional amplifiers 30 and 32 in the main signal path is not a significant factor.

The topology of FIG. 2 achieves phase-matching by implementing the first phase-matching amplifier 30 and the correction amplifier 26 as identical amplifiers with gain 1/β and $1/\beta^3$, respectively. Similarly, the second phase-matching amplifier 32 mimics the scaling amplifier 22 exactly. The nearly identical phase responses of these matched amplifiers equalizes the phase shift through the two signal paths, thus extending the frequency range over which significant distortion cancellation occurs.

The topology of FIG. 2 provides several advantages.

1. Adding the active phase matching blocks 30 and 32 prevents mismatch between the main signal path and the correction signal path from degrading the degree of distortion cancellation. In this topology the main amplifier 20 and replica amplifier 24 are identical by default. The additional amplifiers 30 and 32 in the main signal path provide the necessary delay to match the delay through the scaling amplifier 22 and correction amplifier 26 in the feed-forward signal path. The order of the two phase-matching amplifiers 30 and 32 is important. Placing the block with gain β first will degrade the distortion of the system since distortion performance is proportional to output swing. By ordering the blocks such that the attenuation precedes the gain, the distortion performance is maintained while introducing the necessary phase shift.

2. The use of closed-loop operational amplifiers takes advantage of the effects of feedback in reducing the distortion of each amplifier block.

3. The use of operational amplifiers provides wideband distortion cancellation up to the usable frequency of the component operational amplifiers.

4. This architecture is realizable as both a fully-differential and a single-ended solution.

5. The architecture is not limited to any particular amplifier design. The main amplifier 20 and replica amplifier 24 can be implemented as voltage feed-back, current feed-back, variable gain, programmable gain, fully-differential, or any valid combination of these, or other, common topologies.

6. The architecture also applies to intra-amplifier design. Identify a distortion-producing stage and consider it the main "amplifier". Closing a feed-forward loop around this distortion-producing stage could serve to cancel a significant portion of the overall amplifier's distortion.

Note that the distortion cancellation is maintained as the frequency increases. It is useful to observe the achieved degree of phase matching. The figure of merit used is the frequency at which the phase mismatch is 45 degrees. The claimed implementation of FIG. 2 achieves a frequency of 500 MHz for a 45 degree phase mismatch. As a point of comparison, the prior art of FIG. 1 is characterized by a frequency of 67 MHz for a 45 degree phase mismatch in a similar implementation with the same core amplifiers.

Figure 3:
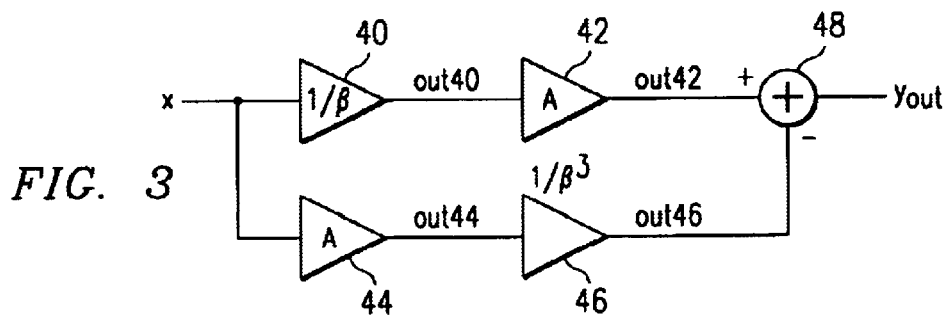
FIG. 3 is a diagram of a second preferred embodiment amplifier using actively phase-matched feed-forward linearization.

A second preferred embodiment is shown in FIG. 3. Through empirical observation of the prior art of FIG. 1, the scaling amplifier 22 proved to be the most significant contributor to phase-mismatch problems. This implies that rearranging the signal paths to eliminate the scaling amplifier 22 from the feed-forward signal path would significantly improve the phase-matching properties of the system.

The second preferred embodiment, shown in FIG. 3, includes scaling amplifier 40, main amplifier 42, replica amplifier 44, correction amplifier 46, summing node 48, input x, and output $Y_{out}$.

The equations that describe the operation of the embodiment of FIG. 3 are shown below:

$$out40 = \frac{1}{\beta}x$$

$$out42 = A\left(\frac{1}{\beta}x\right) + A\alpha_1\left(\frac{1}{\beta}x\right)^3 = \frac{A}{\beta}x + \alpha_1\frac{A}{\beta^3}x^3$$

$$out44 = Ax + \alpha_1 Ax^3$$

$$out46 = \frac{A}{\beta}x + \alpha_1\frac{A}{\beta^3}x^3$$

$$y_{out} = \frac{A}{\beta}x + \alpha_1\frac{A}{\beta^3}x^3 - \frac{A}{\beta}x - \alpha_1\frac{A}{\beta^3}x^3 = \frac{A}{\beta}\left(1 - \frac{1}{\beta^2}\right)x$$

The resulting topology (second preferred embodiment) illustrated in FIG. 3 places the scaling amplifier 40 in the main signal path. By inverting the scaling factor from $\beta$ to $1/\beta$, the revised topology retains the distortion cancellation property while balancing the two signal paths. The underlying principle of the prior art still applies. In this case the scaling amplifier 40 attenuates the input signal rather than amplifying it. The end result remains the same. The main amplifier output signal is lower than the replica amplifier's by a factor of $\beta$. This results in a third-order distortion component that is $\beta^3$ times bigger at the replica amplifier output. By correcting this level down to that at the main amplifier 42, the fundamental component in the feed-forward path is significantly attenuated. When the two signal paths combine, the third-order distortion components cancel while the fundamental is attenuated to a far lesser degree.

Figure 4:
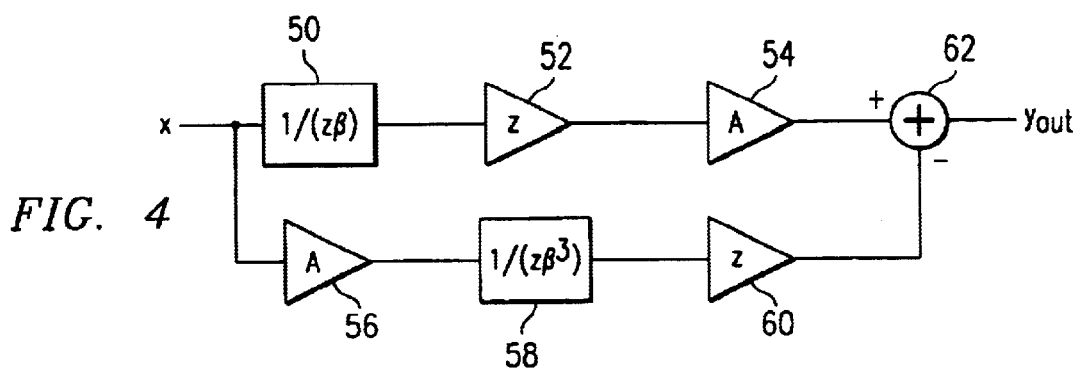
FIG. 4 is a diagram of an alternative embodiment amplifier using actively phase-matched feed-forward linearization.

FIG. 4 shows an alternative embodiment of the architecture of FIG. 3. The embodiment of FIG. 4 includes scaling divider 50, non-inverting buffer 52, main amplifier 54, replica amplifier 56, correction divider 58, non-inverting buffer 60, and summing node 62. The topology illustrated in FIG. 4 implements the scaling and correction amplifiers as resistive voltage dividers 50 and 58 followed by non-inverting buffer stages 52 and 60 with equal gains.

FIG. 4 shows the non-inverting buffers with gains of z. This is a generalization that accounts for the use of decompensated amplifiers with minimum stable gains greater than unity. Empirical observation and underlying amplifier principles indicate that a driving factor in improving distortion cancellation in such a feed-forward system is the bandwidth of the component amplifiers. Decompensated amplifiers represent an amplifier architecture characterized by high −3 dB bandwidths at gains greater than unity. This is an important factor since the feed-forward topologies of FIG. 3 and FIG. 4 result in a loss in signal level of $1/\beta$. Implementing the main and replica amplifiers as decompensated amplifiers with increased gain can absorb this signal loss without a loss in available bandwidth.

The topology of FIG. 4 provides several advantages.

1. The scaling amplifier is moved from the feed-forward signal path to the main signal path. This inherently corrects the major source of phase mismatch in the prior art.

2. While replacing the scaling and correction amplifiers with passive resistor dividers eliminates the problem of phase mismatch and improves distortion by eliminating active components in the signal paths, the problem with this topology is that the load impedance will alter the voltage divider ratio of the correction block, degrading the distortion cancellation. Using a combination of active and passive phase matching by replacing the scaling and correction amplifiers with passive voltage dividers followed by non-inverting buffers provides the best phase matching solution. The passive blocks set the necessary scaling and correction gains for distortion cancellation and the non-inverting buffers isolate the resistive dividers from the rest of the circuit with high-impedance inputs that do not affect the voltage-divider ratios.

3. The significantly improved phase-matching between the two signal paths extends the frequency range of effective distortion cancellation.

4. This architecture improves the bandwidth of the system. Since A is typically greater than z, the bandwidth of the main and replica amplifiers tends to be lower than the scaling and correction buffers. This results in a bandwidth that is approximately that of the main and replica amplifiers.

5. Matching the passive attenuators and amplifier gains is ratiometric. This improves the manufacturability of the implementation.

6. This architecture is realizable as both a fully-differential and a single-ended solution.

7. The architecture is not limited to any particular amplifier design. The main and replica amplifiers can be implemented as voltage feed-back, current feed-back, variable gain, programmable gain, fully-differential, or any valid combination of these, or other, common topologies.

8. The architecture also applies to intra-amplifier design. Identify a distortion-producing stage and consider it the main "amplifier". Closing a feed-forward loop around this distortion-producing stage could serve to cancel a significant portion of the overall amplifier's distortion.

The target applications for the preferred embodiments primarily fall in three areas:

Intermediate frequency (IF) sampling receivers (such as wireless base stations);

Multi-channel power amplifiers (such as wireless and wire-line transmitters);

Test and measurement equipment.

High frequency operation, very high linearity requirements, and markets whose margins are performance driven characterize these applications.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An amplifier comprising:
a first signal path having a scaling amplifier in series with a main amplifier;
a second signal path having a replica amplifier in series with a correction amplifier;
a combining node that combines the first signal path and the second signal path; and
wherein the main amplifier has a gain of A, the replica amplifier has a gain of A, the scaling amplifier has a gain of $1/\beta$, and the correction amplifier has a gain of $1/\beta^3$.

2. The amplifier of claim 1 further comprising:
a first non-inverting buffer coupled between the scaling amplifier and the main amplifier; and
a second non-inverting buffer coupled between the correction amplifier and the combining node.

3. The amplifier of claim 2 wherein the scaling amplifier is a resistive voltage divider and the correction amplifier is a resistive voltage divider.

4. The amplifier of claim 3 wherein the scaling amplifier has a gain of $1/z\beta$, the first non-inverting buffer has a gain of z, the correction amplifier has a gain of $1/z\beta^3$, and the second non-inverting buffer has a gain of z.

5. The amplifier of claim 1 wherein the combining node is a summing node.

6. An amplifier comprising:
a first signal path having a phase matching element in series with a main amplifier;
a second signal path having a scaling amplifier, a replica amplifier, and a correction amplifier coupled in series;
a combining node for combining an output of the first signal path, with an output from the second signal path; and
wherein the main amplifier has a gain of A, the replica amplifier has a gain of A, the scaling amplifier has a gain of $\beta$, and the correction amplifier has a gain of $1/\beta^3$.

7. The amplifier of claim 6 wherein the phase matching element comprises:
a first amplifier having a gain of $1/\beta$; and
a second amplifier having a gain of $\beta$ coupled between the first amplifier and the main amplifier.

8. The amplifier of claim 6 wherein the combining node is a summing node.

9. An amplifier comprising:
a first signal path having a scaling divider, a first non-inverting buffer, and a main amplifier coupled in series;
a second signal path having a replica amplifier, a correction divider, and a second non-inverting buffer coupled in series;
a combining node for combining an output of the first signal path with an output of the second signal; and
wherein the main amplifier has a gain of A, the replica amplifier has a gain of A, the scaling divider has a gain of $1/z\beta$, the correction divider has a gain of $1/z\beta^3$, the first non-inverting buffer has a gain of z, and the second non-inverting buffer has a gain of z.

10. The amplifier of claim 9 wherein the combining node is a summing node.

* * * * *